United States Patent [19]

Egger

[11] Patent Number: 5,161,004

[45] Date of Patent: Nov. 3, 1992

[54] TELEVISION RECEIVER INCLUDING A FREQUENCY DEMODULATOR FOR LOWERING THE THRESHOLD

[75] Inventor: Jean Egger, Paris, France

[73] Assignee: U.S. Philips Corporation, New York, N.Y.

[21] Appl. No.: 667,612

[22] Filed: Mar. 8, 1991

[30] Foreign Application Priority Data

Mar. 9, 1990 [FR] France ................. 90 03024

[51] Int. Cl.⁵ ................. H04N 5/46; H04N 5/455
[52] U.S. Cl. ................. 358/21 R; 358/23; 358/24; 358/188
[58] Field of Search ................. 358/21 R, 23, 24, 25, 358/37, 186, 191.1, 196, 197, 198, 188; 455/337, 339, 340, 307, 312, 266, 195, 190, 142, 144

[56] References Cited

U.S. PATENT DOCUMENTS

| | | | |
|---|---|---|---|
| 4,458,207 | 7/1984 | Favreau | 455/266 |
| 4,479,091 | 10/1984 | Yoshisato | 455/266 |
| 4,527,187 | 7/1985 | Ohta | 358/23 |
| 4,531,148 | 7/1985 | Ohta | 358/23 |
| 4,563,651 | 1/1986 | Ohta | 455/266 |
| 4,584,599 | 4/1986 | Mobley, II | 358/36 |

Primary Examiner—James J. Groody
Assistant Examiner—Sherrie Hsia
Attorney, Agent, or Firm—Edward W. Goodman

[57] ABSTRACT

Bistandard television receiver for signals modulated in frequency, either in PAL or NTSC, or in MAC, with a demodulator arrangement having upstream of a frequency demodulator (5) a varialbe tuning frequency filter (4) controlled at the frequency of the input signal by a feedback returning, in PAL or NTSC, the demodulated signal from the demodulator to the tuning control input of the filter via a first loop having a low-pass filter (7), and a second loop having a bandpass filter (9). The demodulator arrangement includes an adder (8) for adding the signals from each one of the two loops and for applying them to the tuning control input (13) of the filter. The low-pass filter of the first loop is the only phase-shifting element of this loop and, for adapting the television receiver to the MAC standard, the arrangement is simply provided with a switch (12) for rendering the second loop inoperative.

20 Claims, 1 Drawing Sheet

TELEVISION RECEIVER INCLUDING A FREQUENCY DEMODULATOR FOR LOWERING THE THRESHOLD

BACKGROUND OF THE INVENTION

1. Field of the Invention

The invention relates to a bi-standard television receiver for signals modulated in frequency in accordance with a first standard in which a chrominance subcarrier is multiplexed in frequency (for example, PAL, NTSC), or in accordance with a second standard in which the signals are temporally multiplexed (for example, MAC), provided with a demodulator arrangement comprising, upstream of said frequency demodulator, a bandpass filter having a tunable central frequency which is controlled at the frequency of the input signal by means of a feedback returning the demodulated signal from the demodulator to the tuning control input of said filter, this being realized in the above-mentioned first standard via a first loop comprising a low-pass filter in parallel with a second loop comprising a bandpass filter substantially tuned to the frequency of the chrominance subcarrier, an adder for adding the signals from each one of the two loops and for applying them to the tuning control input of the filter having a tunable central frequency.

The invention is particularly used in satellite television for demodulating a signal at an intermediate frequency in the 400-700 MHz frequency range in which signals of the PAL standard as well as of the MAC standard may occur.

It is advisable to avoid the appearance of parasites referred to as "clicks" in the demodulated FM signal. It is known that such parasites occur in the presence of noise because the latter is powerful enough to cause a phase jump of more than 180° of the input signal of the demodulator. The demodulated signal is perturbed to a greater extent as the useful signal at the input is weaker. The threshold is the ratio between the carrier and the noise at the input, measured in a band of reference noise for which the clicks disappear. There is a static threshold (i.e. measured with a continuous modulating signal: white picture) and a dynamic threshold (i.e. measured with a variable modulating signal: for example, test picture of colour bars): the latter is more difficult to lower than the static threshold. Dynamic thresholds are always meant where the threshold values are mentioned in the following description.

2. Description of the Related Art

To avoid the clicks, it is known to reduce the passband before the demodulator by means of a filter or to use a demodulator whose characteristics are chosen in such a way that it cannot follow the phase jumps, or to insert a filter which is controlled at the frequency of the signal.

A demodulator using the latter method is known from the document WO-A-86/03919. According to this document two different circuit diagrams (FIGS. 3 and 4) should be used, dependent on whether the reception is realized in accordance with the NTSC standard or in accordance with the MAC standard. Inter alia, a line delay element should be used to retrieve the phase information.

SUMMARY OF THE INVENTION

It is an object of the invention to lower the dynamic threshold in all standards and particularly in the case of PAL reception with the aid of the simplest and economically possible means, particularly for use in public broadcasting television.

To this end the television receiver according to the invention is characterized in that the low-pass filter of the first loop is the only phase-shifting element of said loop and in that, for adapting the television receiver to the above-mentioned second standard, the arrangement is provided with a switch for rendering the second loop inoperative.

The lowering of the threshold realized with this very simple arrangement is 3 dB in the PAL 25 MHz standard, which is the best result hitherto obtained. It is this standard which yields the best improvement and in the MAC standard, the lowering of the threshold is comparable with that obtained by other known demodulators for lowering the threshold. This is realized, inter alia, with a circuit diagram which is common for the two PAL and MAC standards, with a sole switch for switching from one standard to the other.

In a modification, a high-pass filter is used in series with the bandpass filter which is substantially tuned to the frequency of the chrominance subcarrier.

In a further embodiment, the bandpass filter substantially tuned to the frequency of the chrominance subcarrier is more precisely tuned to a frequency which has a minor phase shift with respect to the frequency of the chrominance subcarrier, said minor phase shift being such that it gives the frequency of the PAL chrominance subcarrier an advance phase shift which is equal to that which would be produced by a high-pass filter arranged in series.

BRIEF DESCRIPTION OF THE DRAWING

The invention will now be described in greater detail by way of non-limitative example with reference to the accompanying drawing, in which.

DETAILED DESCRIPTION OF A PREFERRED EMBODIMENT OF THE INVENTION

Figure 1:
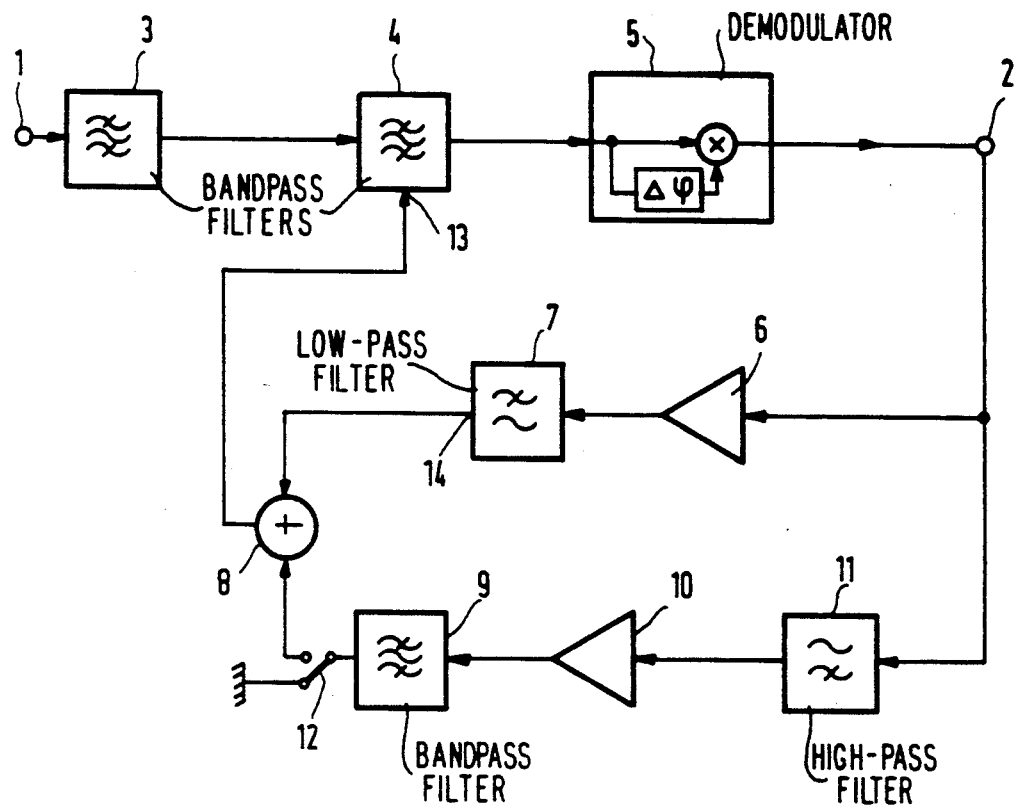
FIG. 1 is a block diagram of the demodulator arrangement of a television receiver according to the invention.

A frequency-modulated signal from a satellite is first amplified and its frequency is transposed in the television receiver after which it is applied to the input 1 of the demodulator arrangement of this receiver, as is shown in FIG. 1. The signal passes two cascade-arranged bandpass filters 3 and 4 and reaches said demodulator 5 which is preferably a demodulator of a well-known type using a quadrature and multiplier circuit. For example, an integrated circuit of the type SL 1452 (Plessey) may be used for this demodulator. Nevertheless, the demodulator 5 may alternatively be of another known type. The demodulated signal produced by the demodulator 5 is supplied from the output of the demodulator 5 to the terminal 2 so as to be treated in known manner in the television receiver in which an image is produced.

To lower the threshold at which clicks may occur, at least three methods are known:

in accordance with a first method, the bandwidth of the filter 3 can be reduced, which has the drawback of the risk of truncation of the signal, producing a considerable distortion. The threshold is dependent on the bandwidth of this filter and on the form of the amplitude/frequency transfer function and also on the modulation type of the signal: for example, the threshold is not the same when the signal received is of the PAL type or of the MAC type (in this case PAL intended for satellite transmission is concerned). There are, inter alia, three PAL types (satellite) with different frequency deviations, namely 16, 20 or 25 MHz. With this method, a filter having a width of 14 MHz in the MAC standard and a width of 30 MHz in the PAL 25 MHz standard is used (which PAL standard is among the three PAL types posing the most difficult problem) and approximately one dB is gained with respect to a reference circuit provided with a filter having a standard width.

In accordance with a second method, which is used when the demodulator is of the PLL type, the parameters of the PLL control loop can be adjusted because the PLL drops out during the phase jumps of the input signal. A parasitic signal is then produced which translates the tentative failure of the circuit so as to follow the phase jump, but this signal may be attenuated by filtering at the output of the demodulator. With this method approximately one dB in the PAL 25 MHz standard is gained and 2 to 3 dB in the MAC standard, likewise as with the afore-mentioned method, and the passband is a bit better in the MAC case.

The third method uses a filter which is narrow but whose tuning frequency follows that of the signal: this is the method chosen here, which the invention proposes to improve.

In the arrangement according to the invention, a filter 3 upstream of the demodulator is used, likewise as in the first method, but this filter has a standard bandwidth and a second filter 4 is added to it whose bandwidth is narrow so as to limit the noise at the output. When used in a bi-standard D2-MAC/PAL (satellite) receiver, the filter 3 is tuned at 479.5 MHz and has a bandwidth of 37 MHz and the filter 4 has a bandwidth of 14 MHz. The truncation of the useful signal is avoided because the central frequency of the filter 4 is variable and follows that of the useful signal. The variability of the central frequency is obtained, for example, by using variable capacitance diodes referred to as "varicap" as tuning capacitances of the filter 4 whose capacitance value is determined by the voltage applied to the tuning frequency control input 13.

This tuning frequency control input 13 is controlled by a feedback signal obtained from the demodulated signal applied to the terminal 2.

A feedback loop comprises an amplifier 6 for adjusting the feedback signal level in order that the variation of the tuning frequency of the filter follows that of the frequency of the input signal as exactly as possible. However, perfect following is impossible and therefore a low-pass filter 7 is inserted in the loop in order to establish a compromise between the part of the signal and the part of the noise which are re-introduced by the loop. For an optimum operation, it is important that a minimal number of perturbations occurs in the phase, i.e. elements other than the filter 7 should not be introduced in this loop.

The more the frequency of the modulating signal increases, the more the control error increases for a given group delay time of the loop. Thus the passband is smaller as the group delay is larger. The spectral density of the power of the modulated signal is different in the MAC and PAL standards. The filter 4 cannot be optimized in the two cases. Thus, the introduction of a switch at the level of the filter 4 has to be considered for adaptation in accordance with the standard: this is difficult because there are considerable differences between the characteristics of the filters adapted to the one or the other standard. It may also be considered to arrange two loops and to choose either the one or the other in accordance with the standard. The invention is based on the recognition that the best solution is to utilize two loops combined, i.e. preserving, in PAL, the loop optimized for the MAC standard and adding a second loop thereto.

The arrangement is thus provided with a second loop which comprises, in cascade from the terminal 2, a high-pass filter 11, an amplifier 10 for adjusting the feedback level and a bandpass filter 9. It should be noted that the order of succession of these different elements in the loop is irrelevant.

The signal at the output 14 of the loop 6, 7 is applied to an adder 8 so as to be added to the signal supplied by the other loop 9, 10, 11 and it is the sum signal from this adder 8 which is applied to the tuning frequency control input 13 for dynamically varying the tuning frequency of the filter 4.

The loop 6, 7 plays a principal role when the frequency deviation is small, i.e. black and white in MAC or in PAL, and the loop 9, 10, 11 takes over, as it were, the first loop proximate to the PAL chrominance subcarrier. The bandpass filter 9 has the same central frequency as that of said subcarrier (4.43 MHz). It plays a role which is analogous to that of the low-pass filter 7: establishing a compromise between the part of the signal and the part of the noise which are reintroduced by the loop. The high-pass filter 11 corrects the phase in the region of said subcarrier.

To simplify the realization of the arrangement, it is possible in practice to omit the high-pass filter 11 (the second loop thus comprises only the elements 9 and 10), because for realizing the phase correction brought about by this high-pass filter, it has been discovered that it is sufficient to slightly shift the tuning of the bandpass filter with respect to the frequency of the PAL chrominance subcarrier so as to give the latter frequency an advance phase shift which produces the same effect on the phase as the series-arranged high-pass filter.

A switch 12 is arranged at the output of the loop 9, 10, (and 11, if any) with which the loop can be rendered inoperative.

The fact that the loop comprising the low-pass filter 7 is permanently kept in function provides the advantage of transmitting the DC component, which proves to be necessary.

In a bi-standard PAL/MAC receiver, the switch 12 is closed in the PAL case, i.e. the loop 9, 10, 11 is operative, and it is open in the MAC case.

When the switch 12 is open, the signal from the second feedback loop 9, 10, 11 may be applied to ground as is shown in the FIG. 1.

In order that the arrangement has optimal qualities, it is advantageous that the elements have the following characteristics:

Bandpass filter 3 equivalent low-pass filter having more than three poles (the filter whose response curve would be obtained by replacing that of the bandpass filter until its central frequency is rendered zero is referred to as the equivalent low-pass filter).

centered at the used intermediate frequency (for example, 479.5 MHz).

passband at 3 dB: between 27 and 37 MHz.

Tunable filter 4
equivalent low-pass filter having a single pole.
centered (in the absence of modulation of the carrier) at the used intermediate frequency (for example, 479.5 MHz).
passband at 3 dB: between 11 and 14 MHz.
minimum distortion at 14 MHz.

High-pass filter 11
if the delay introduced in the loop by the elements 4, 5, 10, 9 is referred to as "T", the filter 11 must bring about a phase shift of $2 \times pi \times T \times FSP$ proximate to the chrominance subcarrier, where "FSP" is the frequency of the subcarrier (pi=3.14159).

Bandpass filter 9
equivalent low-pass filter having a single pole.
centered at the frequency of the chrominance subcarrier.
passband at 3 dB: 2.5 MHz, +/−0.5 MHz.

I claim:

1. A bi-standard television receiver for receiving input signals modulated in frequency in accordance with a first standard, in which a chrominance subcarrier is multiplexed in frequency, or in accordance with a second standard, in which the signals are temporally multiplexed, said bi-standard television receiver being provided with a demodulator arrangement comprising an input for receiving the input signals, a frequency demodulator for demodulating said input signals, a tunable bandpass filter, arranged between said input and said frequency demodulator, having a tunable central frequency which is controlled at the frequency of the input signals by feedback means returning a demodulated output signal from the frequency demodulator to a tuning control input of the bandpass filter, said feedback means being realized in the first standard by a first loop comprising a low-pass filter in parallel with a second loop comprising a bandpass filter substantially tuned to the frequency of the chrominance subcarrier, an adder for adding output signals from said first and second loops and for applying a sum signal to the tuning control input of the tunable bandpass filter, characterized in that the low-pass filter of said first loop is the only phase-shifting element of said first loop, and, for adapting the bi-standard television receiver to the second standard, said demodulator arrangement further comprises a switch coupled to said second loop for rendering said second loop inoperative.

2. A television receiver as claimed in claim 1, wherein said demodulator arrangement comprises, in said second loop, a high-pass filter in series with the bandpass filter which is substantially tuned to the frequency of the chrominance subcarrier.

3. A television receiver as claimed in claim 2, wherein the high-pass filter brings about a phase shift of $2 \times pi \times T \times FSP$ proximate to the chrominance subcarrier, where "FSP" is the frequency of the subcarrier and "T" is the delay introduced in the loop by the elements of the second loop.

4. A television receiver as claimed in claim 1, wherein in the second loop, the bandpass filter substantially tuned to the frequency of the chrominance subcarrier is tuned to a frequency which is slightly shifted with respect to the frequency of the chrominance subcarrier, said shift being such that it gives the frequency of the chrominance subcarrier an advance phase shift of $2 \times pi \times T \times FSP$ proximate to the chrominance subcarrier, where "FSP" is the frequency of the subcarrier and "T" is the delay introduced in the loop by the elements of the second loop.

5. A television receiver as claimed in claim 1, wherein the tunable bandpass filter includes an equivalent low-pass filter having a single pole, is centered at an intermediate frequency used in said television receiver (in the absence of modulation of the carrier), and has a passband at 3 dB between 11 and 14 MHz.

6. A television receiver as claimed in claim 1, wherein in the second loop, the bandpass filter having the frequency of the chrominance subcarrier includes an equivalent low-pass filter having a single pole, is centered at the frequency of the chrominance subcarrier, and has a passband at 3 dB between 2 and 3 MHz.

7. A television receiver as claimed in claim 1, wherein said demodulator arrangement comprises, upstream of the tunable bandpass filter, a further fixed bandpass filter whose equivalent low-pass filter has more than three poles, is centered at an intermediate frequency used in said television receiver, and has a passband at 3 dB between 27 and 37 MHz.

8. A television receiver as claimed in claim 2, wherein the tunable bandpass filter includes an equivalent low-pass filter having a single pole, is centered at an intermediate frequency used in said television receiver (in the absence of modulation of the carrier), and has a passband at 3 dB between 11 and 14 MHz.

9. A television receiver as claimed in claim 3, wherein the tunable bandpass filter includes an equivalent low-pass filter having a single pole, is centered at an intermediate frequency used in said television receiver (in the absence of modulation of the carrier), and has a passband at 3 dB between 11 and 14 MHz.

10. A television receiver as claimed in claim 4, wherein the tunable bandpass filter includes an equivalent low-pass filter having a single pole, is centered at an intermediate frequency used in said television receiver (in the absence of modulation of the carrier), and has a passband at 3 dB between 11 and 14 MHz.

11. A television receiver as claimed in claim 2, wherein in the second loop, the bandpass filter having the frequency of the chrominance subcarrier includes an equivalent low-pass filter having a single pole, is centered at the frequency of the chrominance subcarrier, and has a passband at 3 dB between 2 and 3 MHz.

12. A television receiver as claimed in claim 3, wherein in the second loop, the bandpass filter having the frequency of the chrominance subcarrier includes an equivalent low-pass filter having a single pole, is centered at the frequency of the chrominance subcarrier, and has a passband at 3 dB between 2 and 3 MHz.

13. A television receiver as claimed in claim 4, wherein in the second loop, the bandpass filter having the frequency of the chrominance subcarrier includes an equivalent low-pass filter having a single pole, is centered at the frequency of the chrominance subcarrier, and has a passband at 3 dB between 2 and 3 MHz.

14. A television receiver as claimed in claim 5, wherein in the second loop, the bandpass filter having the frequency of the chrominance subcarrier includes an equivalent low-pass filter having a single pole, is centered at the frequency of the chrominance subcarrier, and has a passband at 3 dB between 2 and 3 MHz.

15. A television receiver as claimed in claim 10, wherein in the second loop, the bandpass filter having the frequency of the chrominance subcarrier includes an equivalent low-pass filter having a single pole, is centered at the frequency of the chrominance subcarrier, and has a passband at 3 dB between 2 and 3 MHz.

16. A television receiver as claimed in claim 2, wherein said demodulator arrangement comprises, upstream of the tunable bandpass filter, a further fixed bandpass filter whose equivalent low-pass filter has more than three poles, is centered at an intermediate frequency used in said television receiver, and has a passband at 3 dB between 27 and 37 MHz.

17. A television receiver as claimed in claim 3, wherein said demodulator arrangement comprises, upstream of the tunable bandpass filter, a further fixed bandpass filter whose equivalent low-pass filter has more than three poles, is centered at an intermediate frequency used in said television receiver, and has a passband at 3 dB between 27 and 37 MHz.

18. A television receiver as claimed in claim 4, wherein said demodulator arrangement comprises, upstream of the tunable bandpass filter, a further fixed bandpass filter whose equivalent low-pass filter has more than three poles, is centered at an intermediate frequency used in said television receiver, and has a passband at 3 dB between 27 and 37 MHz.

19. A television receiver as claimed in claim 4, wherein said demodulator arrangement comprises, upstream of the tunable bandpass filter, a further fixed bandpass filter whose equivalent low-pass filter has more than three poles, is centered at the used intermediate frequency, and has a passband at 3 dB between 27 and 37 MHz.

20. A television receiver as claimed in claim 6, wherein said demodulator arrangement comprises, upstream of the tunable bandpass filter, a further fixed bandpass filter whose equivalent low-pass filter has more than three poles, is centered at an intermediate frequency used in said television receiver, and has a passband at 3 dB between 27 and 37 MHz.

* * * * *